United States Patent [19]

Shinoda

[11] 3,936,321

[45] Feb. 3, 1976

[54] METHOD OF MAKING A COMPOUND SEMICONDUCTOR LAYER OF HIGH RESISTIVITY

[75] Inventor: Daizaburo Shinoda, Tokyo, Japan

[73] Assignee: Nippon Electric Company Limited, Tokyo, Japan

[22] Filed: Jan. 25, 1974

[21] Appl. No.: 436,802

[30] Foreign Application Priority Data
Jan. 31, 1973  Japan................................. 48-13107

[52] U.S. Cl. ................................................. 148/1.5
[51] Int. Cl.² ......................................... H01L 21/00
[58] Field of Search ............................... 148/1.5 CP

[56] References Cited
UNITED STATES PATENTS 3,718,502  2/1973  Gibbons.............................. 148/1.5
3,824,133  7/1974  D'Asaro.............................. 148/1.5

*Primary Examiner*—Peter D. Rosenberg
*Attorney, Agent, or Firm*—Hopgood, Calimafde, Kalil, Blaustein and Lieberman

[57] ABSTRACT

A method is provided for making a semiconductor layer having a high resistivity comprising the steps of implanting ions into a semiconductor comprising gallium and arsenic at a first acceleration voltage at a concentration higher than the limit of solid solubility of said ions in said semiconductor, the ions being of a material which forms a deep energy level in said semiconductor; implanting protons into said semiconductor at an acceleration voltage less than said first acceleration voltage; and then heating the semiconductor, for example, from 300°C to 700°C.

4 Claims, 5 Drawing Figures

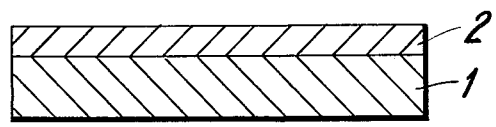
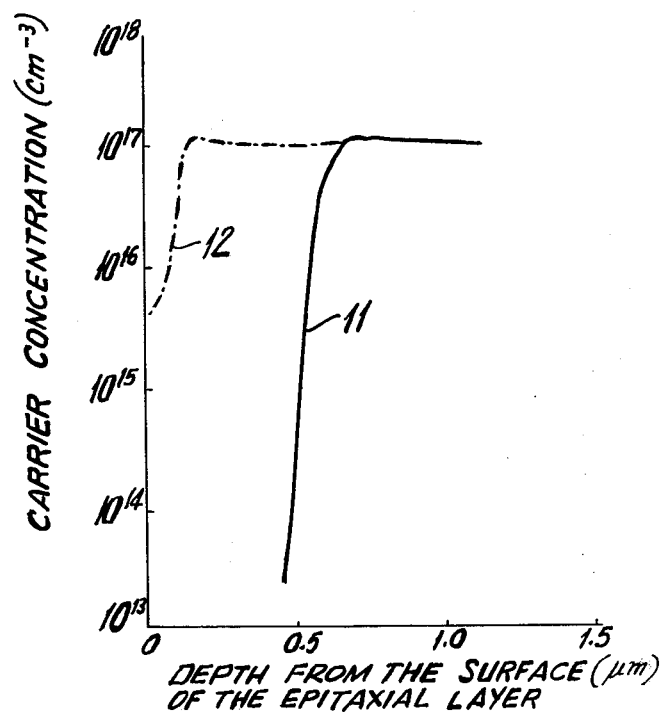
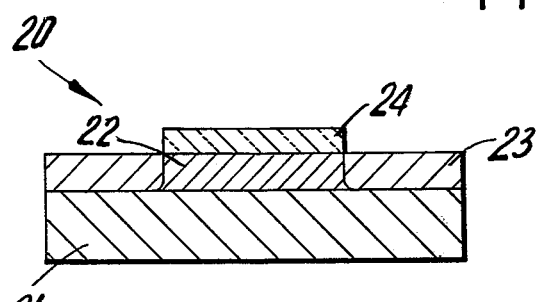
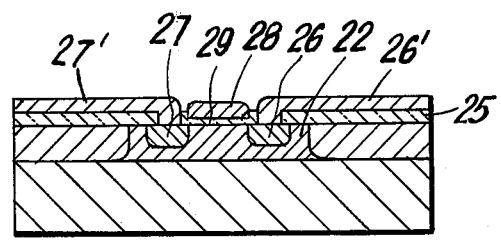
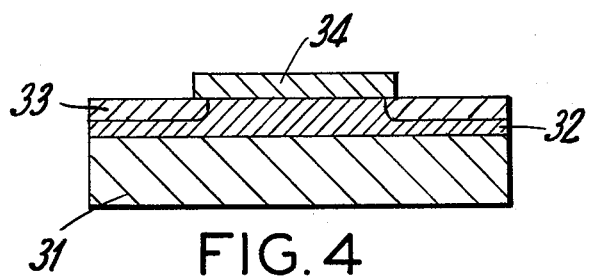

METHOD OF MAKING A COMPOUND SEMICONDUCTOR LAYER OF HIGH RESISTIVITY

The present invention relates to methods of making a compound semiconductor comprising gallium and arsenic with increased resistivity.

In recent years, compound semiconductors such as gallium arsenide have widely been used for various semiconductor devices. The conventional process technique in the art using compound semiconductor involves a number of problems which await solution, unlike the technique where silicon is used.

For example, in the compound semiconductor such as gallium arsenide having a larger band gap than in silicon, the impurity such as chromium or iron forms a deep energy level around the center of the band gap. This makes it possible to form gallium arsenide with a resistivity as high as $10^5$ to $10^8$ ohm-cm, if the impurity such as chromium is doped by suitable method. In practice, however, if the impurity is doped to a high concentration by vapor phase, the crystal structure becomes disordered to hamper the formation of single crystal.

An improvement on the prior art is such as described in "Solid-State Electronics" 1969 vol. 12, pp. 209/214, in which proton is implanted into gallium arsenide by ion implantation technique to a concentration of $10^{13}/cm^2$. According to this method, the layer where proton is implanted becomes highly resistive. In this prior art, however, the high resistivity layer loses its resistivity when it is subjected to heat treatment at a temperature above 400°C.

Therefore, a principal object of the invention is to provide a method of forming a high resistivity layer in a given area on the surface of epitaxial crystal of low resistivity gallium arsenide or its mixed compound.

Another object of the invention is to provide a method of forming a high resistivity layer sufficiently stable against high temperature, free of drawbacks inherent in the prior art method employing proton implantation process.

Briefly, the method of the invention comprises processes in which ions such as chromium ions and iron ions which form a deep energy level in a compound semiconductor containing gallium and arsenic are implanted into the compound semiconductor, and proton is implanted thereinto at an acceleration voltage which is the same or higher than that used in the process of the ion implantation, and then the compound semiconductor is subjected to heat treatment at a temperature of 300° to 700°C.

According to the present invention, impurity ions such as chromium ions and iron ions can be doped into the compound semiconductor to an impurity concentration of higher than $10^{17}$ cm$^{-3}$, while it is impossible in the prior art to dope chromium ions to that impurity concentration. Therefore the present invention permits sufficiently low resistivity compound semiconductor to turn into high resistivity compound semiconductor.

Further, the depth of the high resistivity layer formed in the compound semiconductor can be suitably controlled by the acceleration voltage at which impurity ions such as chromium and iron ions and proton are implanted. Furthermore, the high resistivity layer can be formed with high stability against high temperatures around 700°C.

These advantages may be based on the following facts. The impurity ions such as chromium and iron ions which form a deep energy level can be implanted further than the limit of solid solubility. The impurity atoms implanted are deeply diffused in the semiconductor in the subsequent proton implantation and heat treatment, thus forming an electrically active, deep energy level at a high rate.

The other objects, features and advantages of the invention will becom more apparent from the description taken in conjunction with the accompanying drawings.

FIG. 1 is a sectional view showing a sample used for measuring the distribution of carrier concentration in the depth direction in the ion implantation region obtained by this invention;

FIG. 2 is a graphical view showing the distribution of carrier concentration in the depth direction in the ion implantation region obtained by the invention applied to gallium arsenide;

FIGS. 3(a) and 3(b) are sectional views of the semiconductor device showing the formation of an isolated region in the epitaxial layer according to the present invention; and FIG. 4 is a sectional view showing a Schottky diode formed according to another embodiment of the present invention.

Referring now to FIG. 1, an epitaxial layer 2 of n-type gallium arsenide with a carrier concentration of $1 \times 10^{17}$ cm$^{-3}$ is formed by vapor growth to a thickness of about $2\mu$ on an $n^+$-type gallium arsenide substrate 1 whose resistivity is 0.002 ohm-cm. Prior to the ion implantation process, the surface of this sample is cleaned by a solution mixture of sulfuric acid and hydrogen perioxide. Then, the sample is placed in a sample chamber of an ion implantation apparatus. The sample chamber is evacuated to a high vacuum of $10^{-6}$ Torr. Chromium ions accelerated by an acceleration voltage of 150 KeV are implanted into the epitaxial layer 2 at a rate of $1 \times 10^{13}$ cm$^{-2}$, and then protons are implanted into the layer 2 at the same acceleration voltage. The sample is taken out of the chamber and subjected to heat treatment for two hours at a temperature of 500°C in nitrogen atmosphere.

The distribution of electron concentration in the depth direction of the sample after the heat treatment is shown in FIG. 2, in which a curve 11 indicates the distribution thereof obtained according to the invention, and a curve 12 the distribution obtained by the implantation of chromium ions alone. The distribution of electron concentration was measured in such manner that gold is vapor-deposited on the surface of the sample, thereby forming a Schottky diode, and the distribution is calculated from the voltage dependency of the capacitance of the Schottky diode. It will be seen from FIG. 2 that the surface of the epitaxial layer 2 is more deeply turned to a high resistivity according to the invention than the prior art method.

Referring now to FIGS. 3(a) and 3(b) showing an application of the invention, an n-type gallium arsenide layer having a thickness of 0.5 $\mu$ and an carrier concentration of $1 \times 10^{17}$ cm$^{-3}$ is formed by chemical vapor deposition on a gallium arsenide substrate 21 which has been converted into a semi-insulator by being doped with chromium. A 1.5 $\mu$ thick silicon dioxide film 24 is formed in a given area on the n-type gallium arsenide layer. This silicon dioxide film 24 serves as a mask for the subsequent ion implantation. The surface of the exposed portion of the gallium arsenide layer 22 is cleaned with the mixture solution of sulfuric acid and hydrogen peroxide. The sample 20 is placed in a chamber of an ion implantation apparatus, the chamber being evacuated to a vacuum of $10^{-6}$ Torr. Chromium ions are implanted at a surface concentration of $1 \times 10^{13}$ cm$^{-2}$ at an acceleration voltage of 150 KeV. Then proton is implanted at a surface concentration of $1 \times 10^{13}$ cm$^{-2}$ at the same acceleration voltage. The sample is taken out of the iron implantation apparatus and subjected to heat treatment in nitrogen atmosphere at a temperature of 500°C for two hours. In the resultant sample, the portion 23 whose surface has been exposed is converted to the high resistivity region having a resistivity of more than $10^7$ ohm-cm, and the masked portion 22 keeps its original resistivity. Thus, such a structure is obtained that the masked portion 22 of the epitaxial layer is electrically isolated by the unmasked portion 23 and the substrate 21.

After the surface of the sample 20 is covered with a protective silicon oxide film, the sample is subjected to heat treatment at a temperature of 800°C for two hours it was experimentally proved that the resultant sample 20 did not give rise to change in the resistivity and was capable of maintaining stability.

In the isolated region 22 of the epitaxial layer, an element such as a insulated-gate field effect transistor or a MOS diode may be formed. FIG. 3(b) shows an example of an insulated-gate field effect transistor formed therein. In FIG. 3(b), silicon dioxide 25 is deposited on the whole surface of the gallium arsenide layer 22, a p-type impurity is selectively diffused into the isolated region 22, thereby forming a source region 26 and a drain region 27. Then a gate oxide film 29 is formed on the surface of the isolated region 22, between the source and drain regions 26 and 27, and a source electrode 26', a drain electrode 27', and a gate electrode 28 are formed.

In this transistor, surface leak current is very small. A large number of elements each formed in the respective isolated region 22 and the like and electrically isolated from each other by the high resistivity region 23 can be formed on one gallium arsenide substrate.

Referring now to FIG. 4, an n-type gallium arsenide layer 32 having a carrier concentration of $2 \times 10^{16}$ cm$^{-3}$ and a thickness of 1 $\mu$ is formed by chemical vapor deposition on an $n^+$-type gallium arsenide substrate 31, and chromium ions and proton are continuosly implanted thereinto at 50 KeV using a mask of a 1.5 $\mu$ thick silicon dioxide film (not shown). This sample is subjected to heat treatment in nitrogen atmosphere at a temperature of 500°C for one hour, thereby forming a high resistivity region 33 of 0.5 $\mu$ thickness. The mask of silicon dioxide is removed and gold electrode 34 is deposited, thus forming a Schottky diode. The gold electrode 34 covers such part of the surface of the layer 32 that has been masked by the silicon dioxide mask. The edge of the gold electrode 34 is in contact with the high resistivity region 33.

In this Schottky diode, the surface leak current is small, and the deterioration of the peak voltage which occurs at the edge portion of the metal electrode 34 can be prevented. Furthermore, as in the previous example, the high resistivity region is stable against high temperatures.

In the present invention, the heat treatment is carried out preferably at a temperature range from 300° to 700°C. More specifically, effective temperatures for the heat treatment should be at around 500°C. At temperatures below 300°C, the effect due to heat treatment is not very appreciated, and at temperatures above 700°C, there are possibilities of changing the composition of a compound semiconductor. Further, iron ions whose energy level is near that of chromium may be used instead of the chromium ions implanted in the foregoing examples. Also, instead of gallium arsenide, other compound semiconductor, for example GaAs$_x$P$_{1-x}$ and GaAl$_{1-x}$As where $x$ has value greater than zero but less than one, which consist essentially of gallium and arsenic may be used whereby the same effects of the invention can be realized.

What is claimed is:

1. A method of making a semiconductor layer having a high resistivity comprising the steps of:
   implanting ions into a semiconductor comprising gallium and arsenic at a first acceleration voltage at a concentration higher than the limit of solid solubility of said ions in said semiconductor, said ions being of a material which forms a deep energy level in said semiconductor;
   implanting protons into said semiconductor at an acceleration voltage not less than said first acceleration voltage; and
   heating said semiconductor.

2. A method of making a semiconductor layer as claimed in claim 1, wherein said material is selected from the group consisting of chromium and iron.

3. A method of making a semiconductor layer as claimed in claim 1, wherein said semiconductor is selected from the Group III compounds of GaAs, GaAs$_x$P$_{1-x}$ and GaAl$_{1-x}$As where $x$ has a value greater than zero but less than one.

4. A method of making a semiconductor layer as claimed in claim 1, wherein said semiconductor is heated at temperatures ranging from 300° to 700°C.

* * * * *